United States Patent
Asatani

(10) Patent No.: US 8,270,206 B2
(45) Date of Patent: Sep. 18, 2012

(54) SPIN HIGH-FREQUENCY MIXER AND METHOD OF MANUFACTURE THEREOF

(75) Inventor: Takashi Asatani, Tokyo (JP)

(73) Assignee: TDK Corporation, Tokyo (JP)

( * ) Notice: Subject to any disclaimer, the term of this patent is extended or adjusted under 35 U.S.C. 154(b) by 561 days.

(21) Appl. No.: 12/578,059

(22) Filed: Oct. 13, 2009

(65) Prior Publication Data

US 2010/0097730 A1    Apr. 22, 2010

(30) Foreign Application Priority Data

Oct. 16, 2008 (JP) ............................... P2008-267498

(51) Int. Cl.
*G11C 11/00* (2006.01)

(52) U.S. Cl. ......... 365/158; 365/148; 977/933; 977/935

(58) Field of Classification Search ............... 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, E21.665; 438/3; 428/810–816, 428/817–825.1, 826; 977/933–935
See application file for complete search history.

(56) References Cited

U.S. PATENT DOCUMENTS

| 7,764,136 B2 * | 7/2010 | Suzuki et al. | 331/107 SL |
| 8,013,408 B2 * | 9/2011 | Maehara et al. | 257/421 |
| 2008/0144232 A1 * | 6/2008 | Kaka et al. | 360/324.1 |
| 2009/0243698 A1 * | 10/2009 | Kakinuma et al. | 327/356 |

FOREIGN PATENT DOCUMENTS

| JP | A-8-204458 | 8/1996 |
| JP | A-2006-295908 | 10/2006 |
| JP | A-2009-135471 | 6/2009 |

* cited by examiner

*Primary Examiner* — Richard Elms
*Assistant Examiner* — Harry W Byrne
(74) *Attorney, Agent, or Firm* — Oliff & Berridge, PLC

(57) ABSTRACT

A spin high-frequency mixer includes a spin current generator generating a spin current upon input of a local oscillator signal, a TMR device which inputs a high-frequency signal and the spin current and generates a mixed signal, and an output device outputting the generated mixed signal from the TMR device.

7 Claims, 15 Drawing Sheets

SPIN HIGH-FREQUENCY MIXER AND METHOD OF MANUFACTURE THEREOF

BACKGROUND OF THE INVENTION

1. Field of the Invention

The present invention relates to a spin high-frequency mixer which uses spin torque, and a method of manufacture thereof.

2. Related Background Art

Advances have been made recently in information communications technology that uses radio waves of higher frequencies, such as wide-band code division multiple access (CDMA) using frequencies in the 2 GHz band, Bluetooth using frequencies in the 2.4 GHz band, and wireless LANs using even higher frequency waves.

In the terminals and in the equipment used in wireless base stations that are employed for such information communications, it is common for radio waves received from an antenna, for example, to be converted into lower frequency signals. In such cases, a high-frequency mixer circuit that employs a differential amplifier circuit is used to convert high-frequency signals into lower frequency signals.

An example of prior art which uses such as a high-frequency mixer circuit is the active mixer disclosed in Japanese Patent Application Laid-open No. H08-204458. This disclosure describes an high-frequency mixer having a field effect transistor (FET) that inputs high-frequency signals (RF signals) to a drain, inputs local oscillator (LO) signals to a gate, and extracts intermediate frequency (IF) signals from a source.

However, in an active mixer such as a high-frequency mixer disclosed in Japanese Patent Application Laid-open No. H08-204458, RF signals and LO signals are mixed using the field effect transistor. Because this field effect transistor is required to have both high-frequency characteristics and low-frequency characteristics, it is difficult to suppress low-frequency flicker noise. As a result, the noise characteristics are inferior to those of a passive mixer.

At the same time, passive mixers are devices which employ the non-linearity of a diode; with the LO signal as a bias, current flows to the diode, and the corresponding change in the differential resistance of the diode is used. Also, in order to use the non-linearity of the diode, the change in resistance must be made sufficiently large. Along with this, the current due to the LO signal must be increased to some degree. However, increasing the current causes shot noise due to the current to appear in the output. Hence, the noise cannot be reduced to a sufficient degree even with a passive mixer that uses a diode.

SUMMARY OF THE INVENTION

It is therefore an object of the present invention to provide high-frequency mixers capable of having improved noise characteristics.

A first spin high-frequency mixer is characterized by comprising a spin current generator for generating a spin current upon input of a local oscillator (LO) signal, a magnetoresistance device which inputs an RF signal and the spin current and generates a mixed signal, and an output device for outputting the generated mixed signal from the magnetoresistance device.

In the first spin high-frequency mixer, the spin current generated by the input of an LO signal to the spin current generator is injected to a magnetoresistance device to which an RF signal has been input. The magnetoresistance device multiplies the LO signal with the RF signal, generating a mixed signal having a frequency modulated with respect to the LO signal and the RF signal. Shot noise which appears in the mixed signal in this case is substantially dependent only on current from the RF signal; hence, unlike in passive mixers which use a diode, substantially no shot noise dependent on current from the LO signal is included. Because a mixed signal having a frequency modulated with respect to the LO signal and the RF signal is generated in this way without using a diode, shot noise generation, which is a problem in passive mixers that use a diode, can be suppressed.

In a second high-frequency mixer, the spin current generator in the first spin high-frequency mixer comprises a first spin filter layer comprising a ferromagnetic material, a second spin filter layer having a direction of magnetization opposite to that of the first spin filter layer, and an electrically conductive, nonmagnetic layer interposed between the first spin filter layer and the second spin filter layer; the magnetoresistance device in the first spin high-frequency mixer has a pinned layer having the same direction of magnetization as the first spin filter layer or the second spin filter layer, a free layer which changes magnetization direction upon injection of the spin current, and a tunnel bather layer interposed between the pinned layer and the free layer; and the nonmagnetic layer and the free layer in the first spin high-frequency mixer are electrically connected.

In this way, a spin current may be generated by feeding an LO signal to a first spin filter layer and a second spin filter layer having mutually opposed directions of magnetization. Also, the spin current may be injected through a nonmagnetic layer to the free layer of a magnetoresistance device in which an RF signal has been input. Because the direction of polarization of electron spin within the spin current injected to this free layer aligns with the direction of magnetization of the first spin filter layer or aligns with the direction of magnetization of the second spin filter layer synchronous with the LO signal frequency, the direction of magnetization of the free layer of the magnetoresistance device can be varied synchronously with the LO signal. Along with this, the impedance of the magnetoresistance device varies synchronously with the LO signal. As a result, in the magnetoresistance device, the RF signal and LO signal that have been input are multiplied with each other, enabling the generation of a mixed signal having a frequency modulated with respect to the LO signal and the RF signal.

In a third spin high-frequency mixer, the spin current generator and the magnetoresistance device in the first or second spin high-frequency mixer are provided at separated positions on one semiconductor substrate, the second spin filter has an end removed therefrom, and a coupling nonmagnetic layer is provided so as to bridge between an exposed region of the nonmagnetic layer where the end of the second spin filter layer has been removed and the free layer of the magnetoresistance device, and so as not to come into contact with the second spin filter layer.

By employing such a construction, with the spin current generator and the magnetoresistance device in a separated state, the spin current generated by the spin current generator can flow into the magnetoresistance device through the coupling nonmagnetic layer. This makes it possible to suppress LO signal leakage to the output. In addition, the leakage to the output of shot noise accompanying the LO signal current can be suppressed.

In a fourth spin high-frequency mixer of the invention, an RF signal source which inputs the RF signal to the magnetoresistance device in any one of the first to third spin high-frequency mixers of the invention has a higher impedance than the magnetoresistance device. When the RF signal source impedance is sufficiently high compared with the impedance of the magnetoresistance device, an electrical current proportional to the RF signal flows to the magnetoresistance device, with the current value being substantially dependent on changes in the resistance of the magnetoresistance device. As a result, a voltage proportional to the RF signal and the resistance of the magnetoresistance device is applied to the magnetoresistance device. In this way, the voltage that appears at both ends of the magnetoresistance device is proportional to the product obtained by multiplying the RF signal with the resistance of the magnetoresistance device. As a result, in the magnetoresistance device, by multiplying together the RF signal and LO signal that have been input, a mixed signal having a frequency modulated with respect to the LO signal and the RF signal can be generated.

In a fifth spin high-frequency mixer of the invention, the output device in any one of the first to fourth spin high-frequency mixers of the invention has a higher impedance than the magnetoresistance device.

A first method of manufacturing a spin high-frequency mixer according to the invention is characterized by including the steps of forming a spin current generator by successively depositing, on a semiconductor substrate, a first spin filter layer, a nonmagnetic layer and a second spin filter layer; forming on the semiconductor substrate, at a position separated from the spin current generator, a magnetoresistance device comprising a pinned layer, a tunnel barrier layer and a free layer; removing an end of the second spin filter layer; and forming a coupling nonmagnetic layer so as to bridge between an exposed region of the nonmagnetic layer, where the end of the second spin filter layer has been removed and the free layer of the magnetoresistance device, and so as not to come into contact with the second spin filter layer.

A spin high-frequency mixer capable of enhancing the noise characteristics can be manufactured by the foregoing first method of manufacturing a spin high-frequency mixer.

With the first spin high-frequency mixer and the method of manufacture thereof, improved noise characteristics can be achieved.

DESCRIPTION OF THE PREFERRED EMBODIMENTS

Those embodiments of the present invention which are believed to represent the best modes of practicing the invention are described in detail below in conjunction with the appended diagrams. In the descriptions that follow, like or similar elements are denoted by like reference symbols, and the unnecessary repetition of explanations is avoided.

First Embodiment

Figure 1:
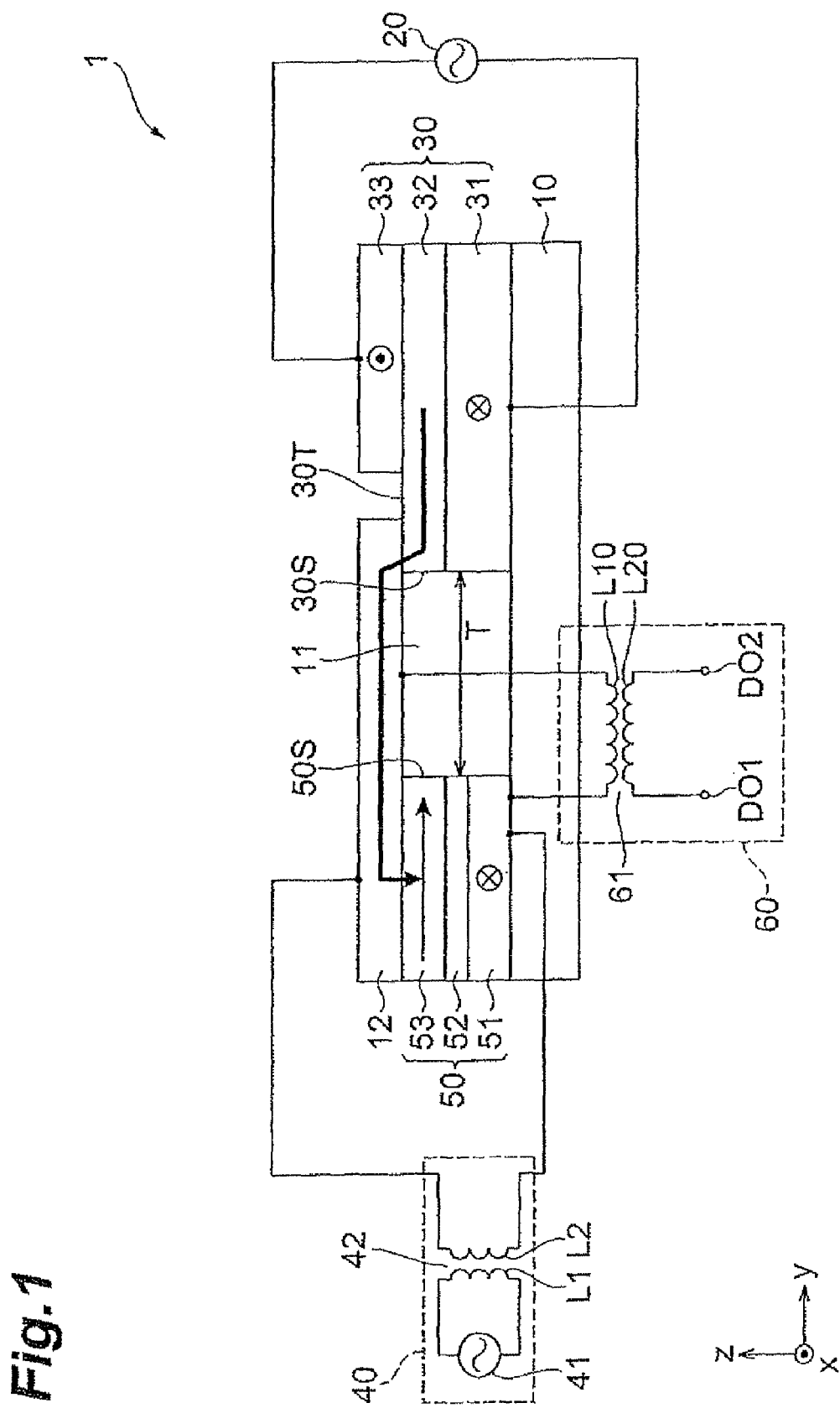
FIG. 1 is a schematic view showing a spin high-frequency mixer according to a first embodiment of the invention.

FIG. 1 is a diagram which schematically shows a spin high-frequency mixer 1 according to a first embodiment of the invention. Referring to FIG. 1, the spin high-frequency mixer 1 of the present embodiment comprises a LO signal generator 20 which generates and outputs a local oscillator (LO) signal, a spin current generator 30 which is provided on a semiconductor substrate 10 and which inputs the LO signal from the LO signal generator 20 and generates a spin current, an RF signal output part 40 which generates and outputs a high-frequency signal (RF signal), a magnetoresistance device (tunneling magnetoresistance, or "TMR" device) 50 which is provided on the same semiconductor substrate 10 and which inputs the RF signal from the RF signal output part 40 and the spin current from the spin current generator 30 and generates mixed signal, and an output part 60 which outputs the mixed signal that has been generated from the TMR device 50. In the RF signal output part 40, a high-frequency signal source (RF signal source) 41 which outputs the RF signal to the TMR device 50 has a higher impedance than the TMR device 50. The output part 60 also has a higher impedance than the TMR device 50.

When the impedance of the RF signal source 41 is sufficiently high compared with the impedance of the TMR device 50, an electrical current proportional to the RF signal flows to the TMR device 50, and the current value is substantially independent of changes in the resistance of the TMR device 50. As a result, a voltage proportional to the RF signal and the resistance of the TMR device 50 is applied to the TMR device 50. Consequently, the voltage that appears at both ends of the TMR device 50 is proportional to the product of the RF signal multiplied with the resistance of the TMR device 50.

The LO signal generator 20 is connected to a first spin filter layer 31 and a second spin filter layer 33 (both described subsequently) of the spin current generator 30, generates an alternating-current LO signal $I_{LO}$ (=A sin $\omega_1$t) having a frequency $f_1$ (=$\omega_1/2\pi$). The generated LO signal $I_{LO}$ is fed between the first spin filter layer 31 and the second spin filter layer 33. Here, A, $\omega_1$ and t denote respectively the amplitude of the LO signal $I_{LO}$, angular frequency of the LO signal $I_{LO}$ and time.

The spin current generator 30 comprises the following layers which have been sequentially deposited on a semiconductor substrate 10: a first spin filter layer 31 having a magnetization oriented in the negative direction of the x-axis, an electrically conductive nonmagnetic layer 32, and a second spin filter layer 33 having a magnetization oriented in the positive direction of the x-axis. The purpose of the spin current generator 30 is to change the direction of magnetization in the free layer 53 of the TMR device 50 synchronously with the LO signal $I_{LO}$. The end of the spin current generator 30 on the side facing the TMR device 50 has been provided with a step formed by removing the end of the second spin filter layer 33, leaving the nonmagnetic layer 32 exposed in the area of such removal. Electrodes (not shown) are provided at the respective sites of the spin high-frequency mixer 1 where the LO signal generator 20, the RF signal output part 40 and the output part 60 are connected.

The spin current generator 30 inputs the LO signal which has been output from the LO signal generator 20, between the first spin filter layer 31 and the second spin filter layer 33 and, by changing the polarity of the LO signal $I_{LO}$, generates a spin current by spin-polarized electrons from the first spin filter layer 31 or the second spin filter layer 33, and injects the spin current to the nonmagnetic layer 32. The direction of polarization of the spin of electrons within the spin current injected to the nonmagnetic layer 32 becomes the same as the orientation of magnetization in the first spin filter layer 31 (negative direction of x-axis) when the current is injected from the first spin filter layer 31, and becomes the same as the orientation of magnetization in the second spin filter layer 33 (positive direction of x-axis) when the current is injected from the second spin filter layer 33. That is, synchronous with the frequency $f_1$ of the LO signal $I_{LO}$, the direction of polarization of the spin of electrons that flow to the nonmagnetic layer 32 becomes the same as the orientation of magnetization in the first spin filter layer 31 or becomes the same as the orientation of magnetization in the second spin filter layer 33.

The TMR device 50 is provided on the same semiconductor substrate 10 at a position separated by an interval T from a sidewall 50S parallel to the direction of deposition in the spin current generator 30, and so as to face an endwall 30S of the spin current generator 30. The endwall 30S is continuous with an exposed region 30T where an end of the second spin filter layer 33 has been removed. The TMR device 50 comprises the following layers which have been deposited in order: a pinned layer 51 in which the orientation of magnetization has been fixed in the same direction (negative direction of x-axis) as the direction of magnetization in the first spin filter layer, a tunnel barrier layer 52, and a free layer 53 in which the orientation of magnetization changes in accordance with the external spin current. A distinctive characteristic of the TMR device 50 is that, if the orientation of magnetization is the same for both the free layer 53 and the pinned layer 51, the transmittance of polarized spin electrons will be large, giving the TMR device 50 a small resistance. On the other hand, if the orientation of magnetization by the two ferromagnetic materials is mutually opposed, the transmittance of polarized spin electrons will be small, giving the TMR device 50 a large resistance.

An electrically conductive, coupling nonmagnetic layer 12 is provided so as to bridge between the exposed region 30T of the nonmagnetic layer 32 in the spin current generator 30 and the free layer 53 of the TMR device 50, and so as not to come into contact with the second spin filter layer 33.

The RF signal output part 40 comprises an RF signal source 41, and a transformer comprising a primary side coil L1 and a secondary side coil L2. The number of turns in the primary side coil L1 is either the same as the number of turns in the secondary side coil L2 or, in cases where the RF signal source 41 has a low impedance, is preferably smaller than the number of turns in the secondary side coil L2. In the transformer 42, both ends of the primary side coil L1 are connected to the RF signal source 41, one end of the secondary side coil L2 is connected to the coupling nonmagnetic layer 12 and the other end is connected to the pinned layer 51 of the TMR device 50. The RF signal source 41 generates an AC voltage RF signal $V_{RF}$ (=B sin $\omega_2$t) having a frequency $f_2$ (=$\omega_2/2\pi$), which RF signal $V_{RF}$ is input to the primary side coil L1 of the transformer 42 connected to the RF signal source 41. Here, B, $\omega_2$ and t respectively represent the amplitude of the RF signal $V_{RF}$, angular frequency of the RF signal $V_{RF}$ and time.

The RF signal $V_{RF}$ is input to the primary side coil L1, the flow of current through the primary side coil L1 generating a magnetic field. Because the RF signal source 41 has a large impedance, a current $i_1$ ($\propto$B sin with $\omega_1$t) proportional to the RF signal $V_{RF}$ is generated in the primary side coil L1. When the number of turns in the secondary side coil L2 is the same as the number of turns in the primary side coil L1, substantially the same current $i_2$ ($\propto$B sin $\omega_2$t) proportional to $i_1$ is also generated in the secondary side coil L2. When the number of turns in the secondary side coil L2 is larger than the number of turns in the primary side coil L1, a smaller current $i_2$ ($\propto$B sin $\omega_2$t) proportional to $i_1$ is also generated in the secondary side coil L2. In either case, the current $i_2$ flows through the coupling nonmagnetic layer 12 and to the TMR device 50. As a result, the relationship expressed by formula (1) below is established between the current $I_{TMR}$ (proportional to the induced electromotive force $e_2$) that flows between the coupling nonmagnetic layer 12 and the TMR device 50.

$$I_{TMR} \propto \sin \omega_2 t \quad (1)$$

The spin currents which have flowed into the nonmagnetic layer 32 from the first and second spin filter layers 31 and 33 pass through the coupling nonmagnetic layer 12 and are injected to the free layer 53 of the TMR device 50. Because a spin magnetic moment can be imparted to the free layer 53 by the polarized spins within the spin currents, the orientation of magnetization of the free layer 53 is controlled is this way. Hence, when the spin current generated from the first spin filter layer 31 flows into the free layer 53, the orientation of magnetization in the free layer 53 approaches the x-axis negative direction; and when the spin current generated from the second spin filter layer 33 flows into the free layer 53, the orientation of magnetization in the free layer 53 approaches the x-axis positive direction.

Also, when the spin current generated from the first spin filter layer 31 has been injected, the orientation of magnetization in the free layer 53 and the orientation of magnetization in the pinned layer 51 approach the same direction, making the impedance $Z_{TMR}$ of the TMR device 50 small. Conversely, when the spin current generated from the second spin filter layer 33 has been injected, the impedance $Z_{TMR}$ of the TMR device 50 becomes large. As a result, the relationship expressed by formula (2) below holds for the impedance $Z_{TMR}$ of the TMR device 50, which varies synchronously with the LO signal $I_{LO}$.

$$Z_{TMR} \propto \sin \omega_1 t \quad (2)$$

From above formulas (1) and (2) and the relationship V=I×Z, the voltage $V_{TMR}$ that arises between the coupling nonmagnetic layer 12 and the TMR device 50 can be expressed by formula (3) below. Here, V, I and Z respectively stand for the voltage, current and impedance; phase differences are excluded for the sake of simplicity. $V_{TMR-}$ is a component which relates to $\cos\{2\pi(f_1-f_2)t\}$, and $V_{TMR+}$ is a component which relates to $\cos\{2\pi(f_1+f_2)t\}$.

$$V_{TMR} \propto \sin\omega_1 t \times \sin\omega_2 t$$

$$\propto [\cos(\omega_1-\omega_2)t - \cos(\omega_1+\omega_2)t]$$

$$\propto [\cos 2\pi(f_1-f_2)t - \cos 2\pi(f_1+f_2)t]$$

$$\propto V_{TMR-} + V_{TMR+} \qquad (3)$$

In this way, because the LO signal $I_{LO}$ and the RF signal $V_{RF}$ are multiplied in the TMR device 50, a mixed signal has been frequency modulated to $f_+=f_1+f_2$ and $f_-=f_1-f_2$ with respect to the LO signal $I_{LO}$ of frequency $f_1$ and the RF signal $V_{RF}$ of frequency $f_2$ is generated.

The output part 60 comprises a transformer 61 comprising a primary side coil L10 and a secondary side coil L20. The primary side coil L10 is connected between the coupling nonmagnetic layer 12 and the pinned layer 51, and generates an induced electromotive force $V_1$ of substantially the same magnitude as the $V_{TMR}$ that arises between the coupling nonmagnetic layer 12 and the pinned layer 51 ($V_1 \cong V_{TMR}$). Output terminals DO1 and DO2 are provided on the secondary side coil L20. An induced electromotive force $V_2$ proportional to the induced electromotive force $V_1$ ($V_2 \propto V_{TMR} \propto \sin\omega_1 t \cdot \sin\omega_2 t$) arises between the output terminals DO1 and DO2, which induced electromotive force $V_2$ is output from output terminals DO1 and DO2.

Figure 2:
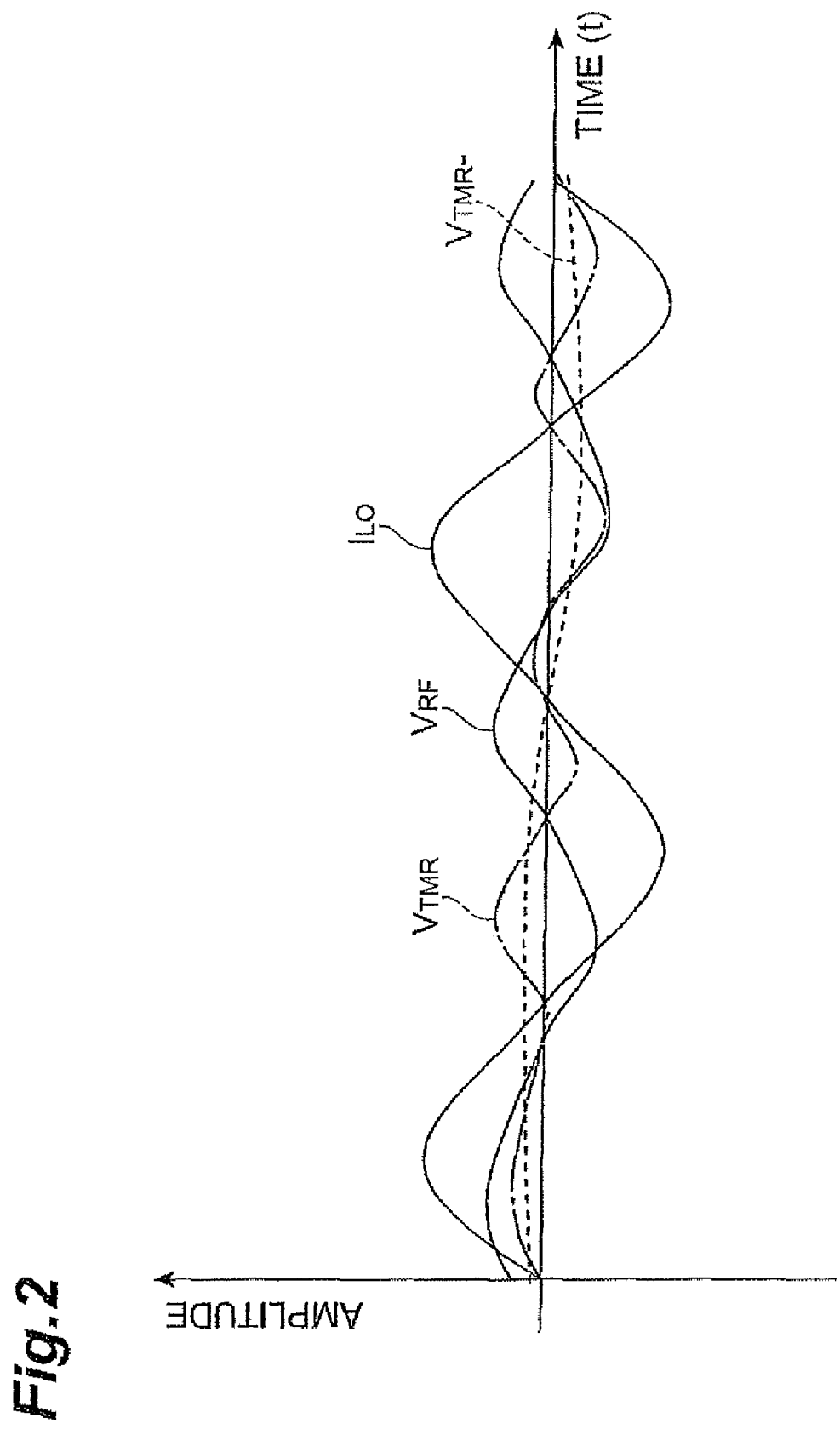
FIG. 2 is a diagram showing the results of frequency modulation by a spin high-frequency mixer according to the first embodiment of the invention.

The output part 60 is thus able, by way of output terminals DO1 and DO2, to output from the TMR device 50 a mixed signal $V_{TMR}$ obtained by multiplying the LO signal $I_{LO}$ with the RF signal $V_{RF}$ and modulating the frequency to $f_+=f_1+f_2$ and $f_-=f_1-f_2$. FIG. 2 shows the components $V_{TMR-}$ of the mixed signal $V_{TMR}$ output by the output part 60 with respect to an LO signal $I_{LO}$ of frequency $f_1$ and an RF signal $V_{RF}$ of frequency $f_2$.

The materials and thickness which may be used in the respective layers are described below.
First Spin Filter Layer 31
  Material: CoFe alloy
  Thickness: 3 nm
Nonmagnetic Layer 32
  Material: Copper
  Thickness: 20 nm
Second Spin Filter Layer 33
  Material: CoFe alloy
  Thickness: 3 nm
Dielectric Layer 11
  Material: $SiO_2$
  Thickness: 12 nm
Coupling Nonmagnetic Layer 12
  Material: Copper
  Thickness: 20 nm
Pinned Layer 51
  Material: CoFeB alloy
  Thickness: 2 nm
Tunnel Barrier Layer 52
  Material: MgO
  Thickness: 0.9 nm
Free Layer 53
  Material: CoFe alloy
  Thickness: 2 nm The distance from the TMR device 50 to the spin current generator 30, i.e., the interval T (T>0) of the dielectric layer 11 on a flat plane parallel to the semiconductor substrate 10, is preferably not more than the spin diffusion length. It is believed that, within this range, the polarized spin of the spin current is inserted into the free layer 53 without damping.

Next, the method of forming the above-described spin high-frequency mixer 1 is described while referring to FIGS. 3 to 7. FIGS. 3 to 7 are schematic diagrams showing successive steps in the method of manufacturing the spin high-frequency mixer 1. The spin high-frequency mixer 1 is manufactured by, for example, the following sequence of steps.

Spin Current Generator Forming Step

Figure 3:
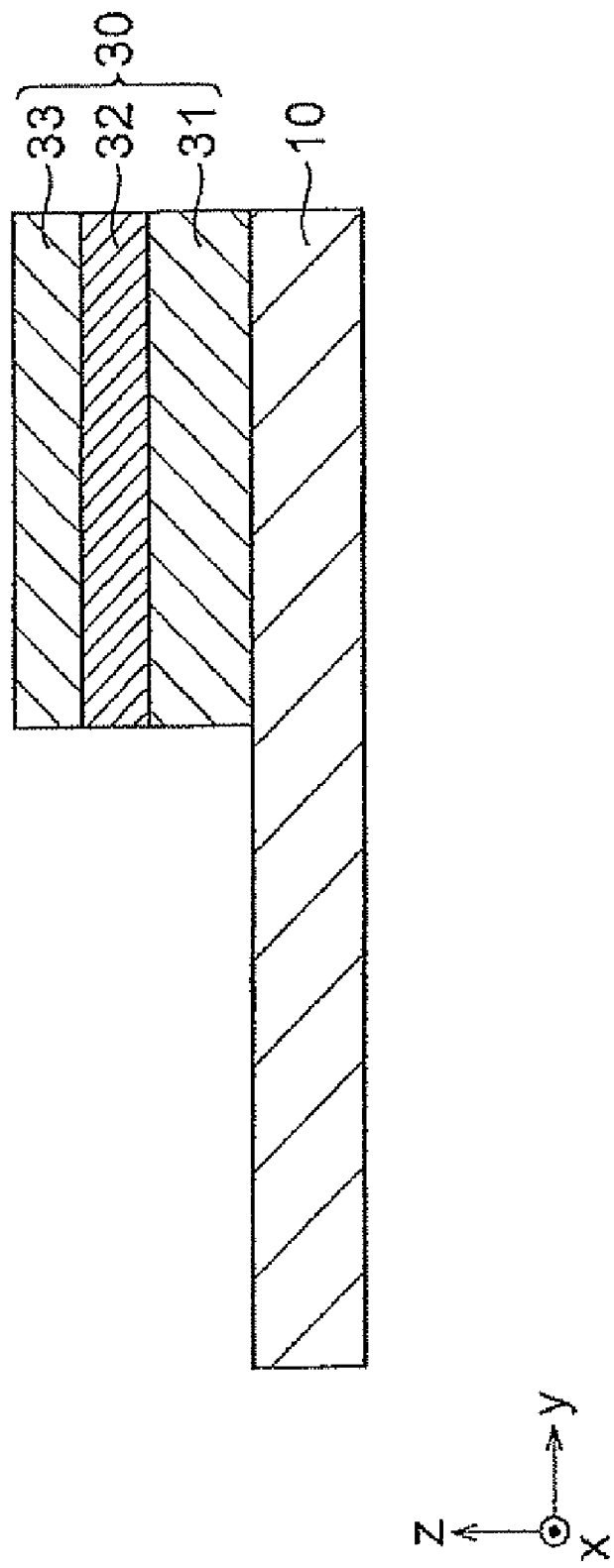
FIG. 3 is a schematic diagram showing a step in a method of manufacturing the spin high-frequency mixer shown in FIG. 1.

First, a spin current generator 30 is formed as shown in FIG. 3. The spin current generator 30 is obtained by successively forming, in a specific shape on a semiconductor substrate 10, a first spin filter layer 31, a nonmagnetic layer 32, and a second spin filter layer 33. These layers are formed by, for example, a sputtering process which utilizes a metal mask, and may be formed in succession while a vacuum is maintained.

TMR Device Forming Step

Figure 4:
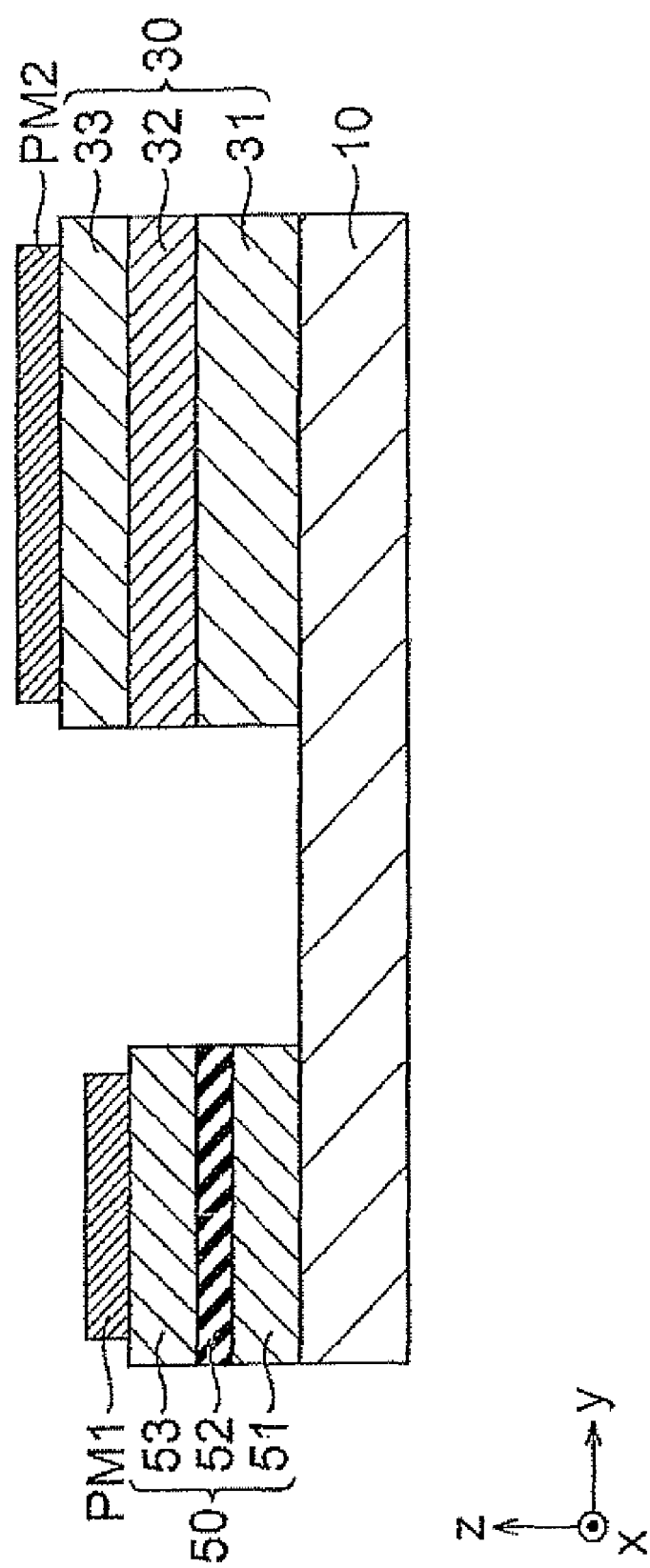
FIG. 4 is a schematic diagram showing another step in a method of manufacturing the spin high-frequency mixer shown in FIG. 1.
Figure 5:
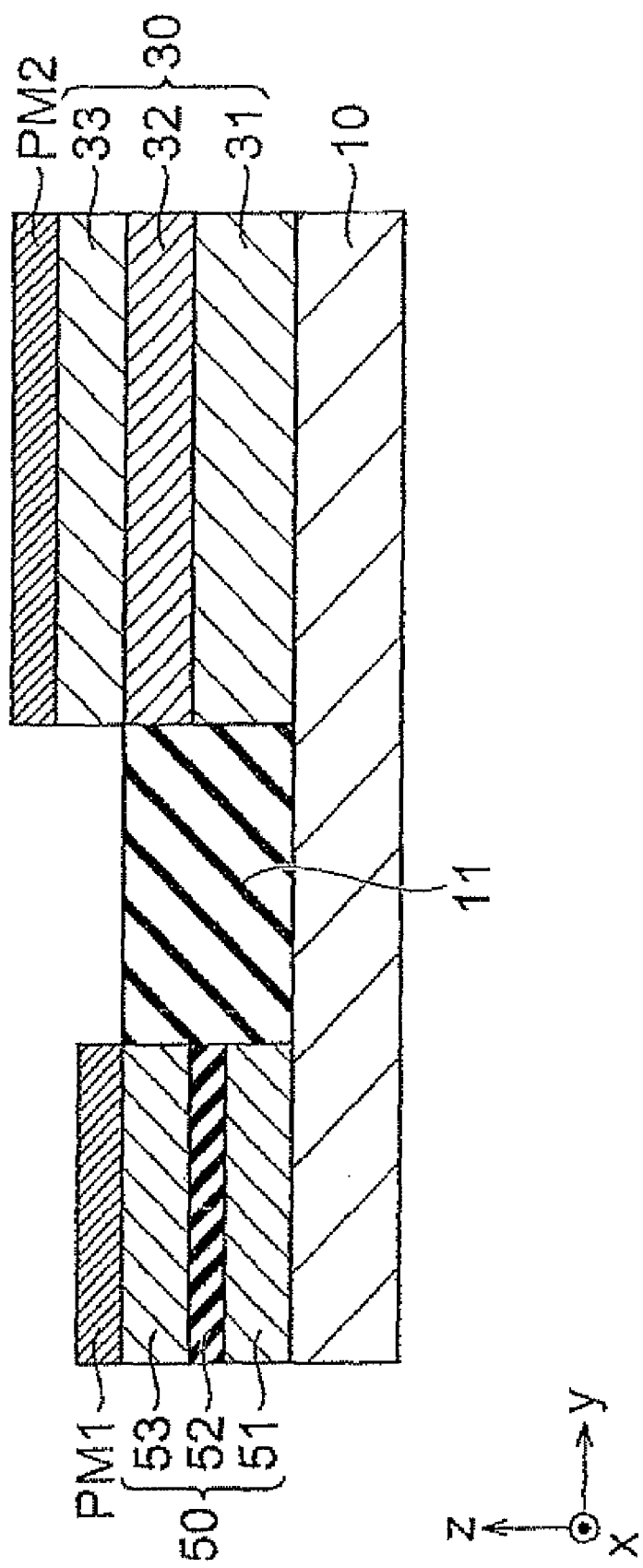
FIG. 5 is a schematic diagram showing yet another step in a method of manufacturing the spin high-frequency mixer shown in FIG. 1.

Next, referring to FIG. 4, a TMR device 50 is formed at a position which is separated by an interval T from the spin current generator 30 on the semiconductor substrate 10. The TMR device 50 is obtained by the successive deposition, using, for example, a sputtering process that employs a metal mask, of a pinned layer 51, a tunnel barrier layer 52 and a free layer 53. Deposition is carried out so that the top surface of the free layer 53 of the TMR device 50 has the same height as the top surface of the nonmagnetic layer 32 of the spin current generator 30.

Etching Step

Next, as shown in FIG. 4, resist masks PM1 and PM2 for masking rectangular shapes or the like are respectively formed on the free layer 53 of the TMR device 50 and on the second spin filter layer 33 of the spin current generator 30, and the unmasked regions are etched by, for example, a dry etching process to a depth that the semiconductor substrate 10 is exposed. Next, referring to FIG. 5, without removing the resist masks PM1 and PM2, a sputtering system or the like is used to form a dielectric layer 11 on the semiconductor substrate 10 in the region between the TMR device 50 and the spin current generator 30. The dielectric layer 11 is formed in such a way that the height of the top surface thereof is the same as the height of the top surface of the free layer 53 of the TMR device 50 and the height of the top surface of the nonmagnetic layer 32. The resist masks PM1 and PM2 are then removed. In this way, the plurality of layers included in, respectively, the TMR device 50 and the spin current generator 30 may be formed at the same time and in the same shape. The TMR device 50 and the spin current generator 30 are electrically isolated by the dielectric layer 11 interposed therebetween.

Second Spin Filter Layer End Removing Step

Next, using photolithography and etching process, the end of the second spin filter layer 33 of the spin current generator 30 on the dielectric layer 11 side thereof is removed. Specifically, a resist pattern which masks those portions of the second spin filter layer 33 other than the end thereof to be removed is formed, following which the unmasked region of the second spin filter layer 33 is etched by a dry etching process or the like until the nonmagnetic layer 32 is exposed, after which the resist is removed.

Coupling Nonmagnetic Layer Forming Step

Figure 6:
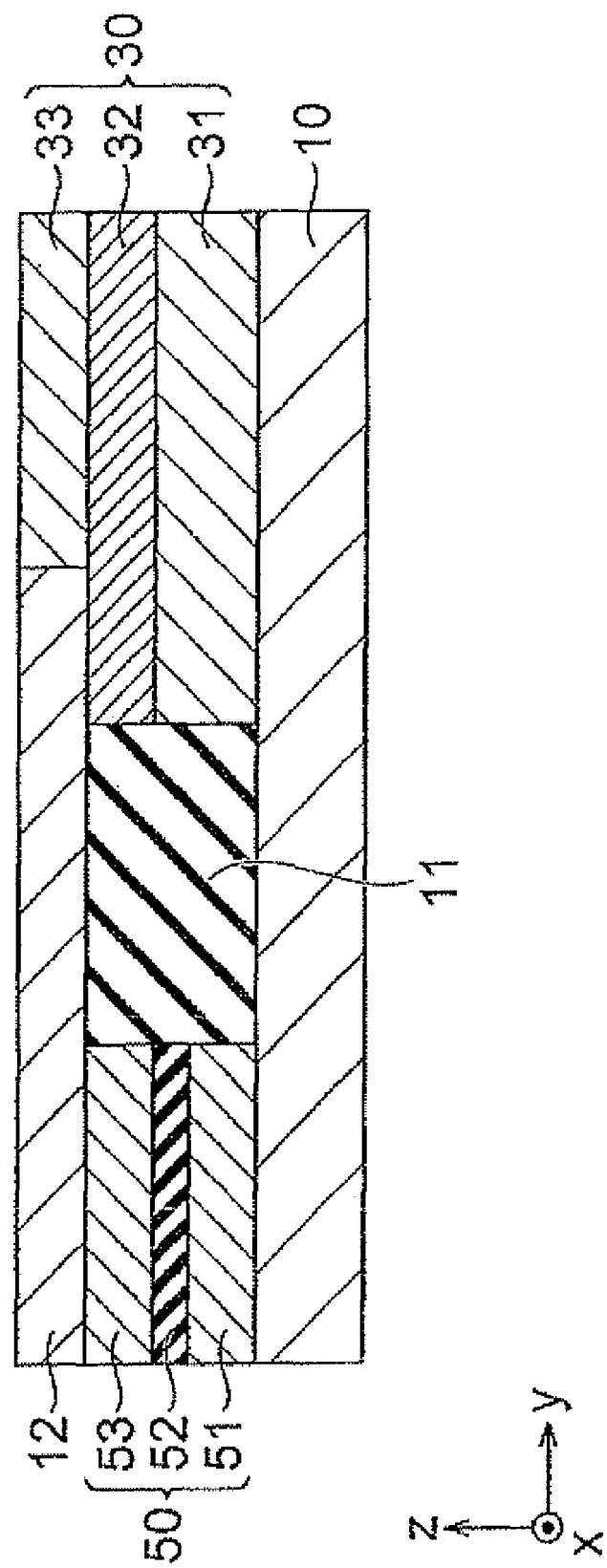
FIG. 6 is a schematic diagram showing a further step in a method of manufacturing the spin high-frequency mixer shown in FIG. 1.
Figure 7:
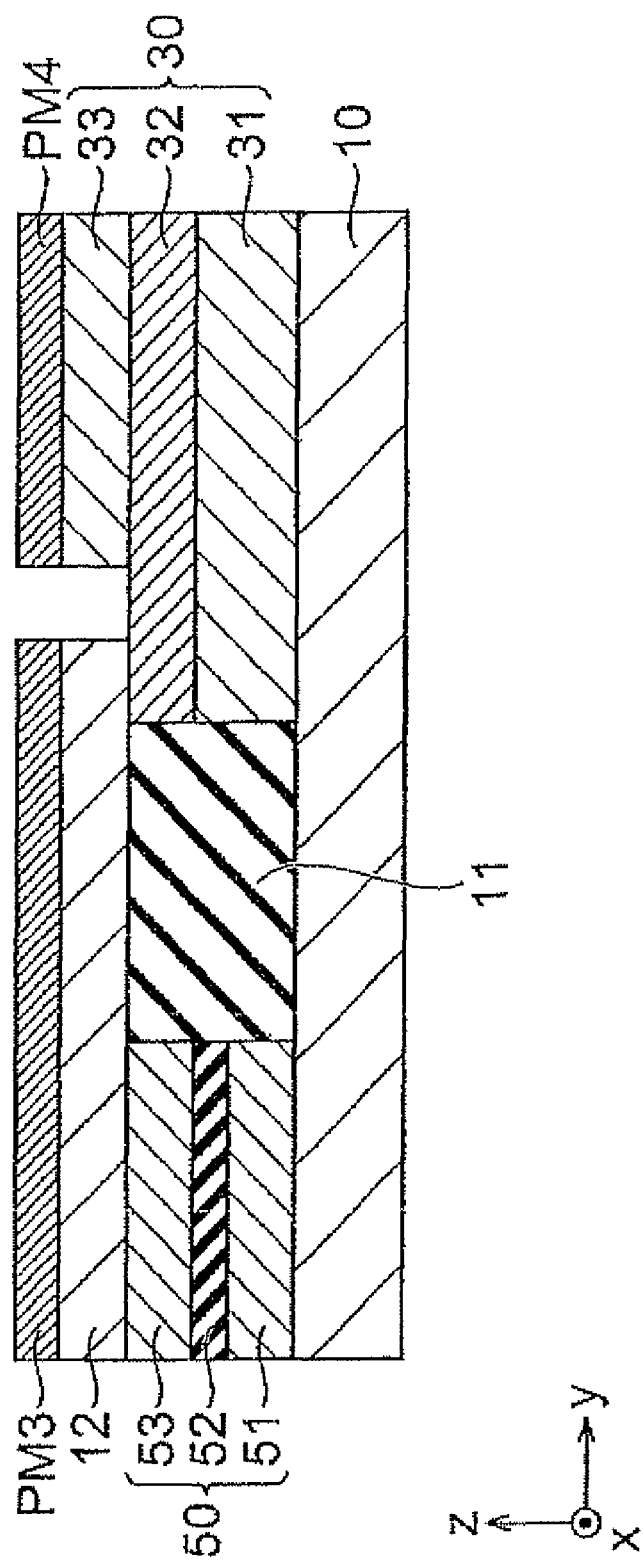
FIG. 7 is a schematic diagram showing a still further step in a method of manufacturing the spin high-frequency mixer shown in FIG. 1.

Next, a coupling nonmagnetic layer 12 for coupling TMR device 50 and the spin current generator 30 which are the electrically isolated mutually is formed. In this step, first, the second spin filter layer 33 is masked with a metal mask or the like and a mask pattern having opened therein only a region that connects the free layer 53 with the exposed region of the nonmagnetic layer 32 is formed, after which a nonmagnetic layer comprising copper or the like is formed throughout. The mask pattern is then removed, lifting off the nonmagnetic layer on the mask pattern together with the mask pattern and resulting in the formation, as shown in FIG. 6, of a coupling nonmagnetic layer 12 that bridges from the TMR device 50 to the area on the nonmagnetic layer 32 where the second spin filler layer 33 has been removed. Next, referring to FIG. 7, resist masks PM3 and PM4 for masking areas other than a region that includes an interface between the coupling nonmagnetic layer 12 and the second spin filter layer 33 are formed.

Next, the unmasked region which includes the interface between the coupling nonmagnetic layer 12 and the second spin filter layer 33 is etched with a dry etching process or the like to a depth that exposes the nonmagnetic layer 32, following which the resist masks PM3 and PM4 are removed. In this way, the nonmagnetic layer 32 of the spin current generator 30 and the TMR device 50 are connected by the coupling nonmagnetic layer 12 while avoiding direct contact between the second spin filter layer 33 and the coupling nonmagnetic layer 12.

Next, an LO signal generator 20 is connected between the first spin filter layer 31 and the second spin filter layer 33, and an RF signal output part 40 and an output part 60 are connected between the pinned layer 51 and the coupling nonmagnetic layer 12, thereby completing the spin high-frequency mixer 1.

The spin high-frequency mixer 1 of the present embodiment operates as described below.

An alternating-current LO signal $I_{LO}$ (=A sin $\omega_1$t) having the frequency $f_1$ is generated by the LO signal generator 20, and the LO signal $I_{LO}$ is input to the first spin filter layer 31 and the second spin filter layer 33. A spin current is then generated from the first spin filter layer 31 and the second spin filter layer 33 according to the polarity of the LO signal $I_{LO}$, and the generated spin current is injected to the free layer 53 by way of the nonmagnetic layer 32 and the coupling nonmagnetic layer 12. When a spin current is generated from the first spin filter layer 31 having the same direction of magnetization as the pinned layer 51, the direction of magnetization in the free layer approaches the direction of magnetization in the pinned layer. When a spin current arises from the second spin filter layer 33 having a direction of magnetization opposed to the direction of magnetization of the pinned layer 51, the direction of magnetization of the free layer approaches a direction opposite to the direction of magnetization of the pinned layer. Therefore, the impedance $Z_{TMR}$ between the coupling nonmagnetic layer 12 and the TMR device 50 varies synchronously with the LO signal $I_{LO}$, and can be expressed as $Z_{TMR} \propto$ sin $\omega_1$t.

On the other hand, when an AC voltage RF signal $V_{RF}$ (=B sin $\omega_2$t) having the frequency $f_2$ is generated from the RF signal source 41, a current $i_1$ ($\propto$B sin $\omega_2$t) proportional to the RF signal $V_{RF}$ arises on the primary side of the transformer 42. Similarly, a current $i_2$ proportional to the current $i_1$ ($\propto$B sin $\omega_2$t) arises on the secondary side; this current $i_2$ flows through the coupling nonmagnetic layer 12 and to the TMR device 50.

Therefore, the current $I_{TMR}$ that flows between the coupling nonmagnetic layer 12 and the TMR device 50 may be expressed as $I_{TMR} \propto$ sin $\omega_2$t.

From the above, the following relationship holds for the voltage $V_{TMR}$ that arises between the coupling nonmagnetic layer 12 and the TMR device 50: $V_{TMR} \propto$ sin $\omega_1$t·sin $\omega_2$t. Thus, in the TMR device 50, because an LO signal $I_{LO}$ and an RF signal $V_{RF}$ are multiplied, mixed signals having frequencies modulated to $f_+ = f_1+f_2$ and $f_- = f_1-f_2$ with respect to the LO signal $I_{LO}$ and the RF signal $V_{RF}$ are generated. The voltage $V_{TMR}$ generated between the coupling nonmagnetic layer 12 and the TMR device 50 generates a primary side induced electromotive force $V_1$ and a secondary side induced electromotive force $V_2$ ($\propto V_{TMR} \propto$ sin $\omega_1$t·sin $\omega_2$t) in the output part 60, and the induced electromotive force $V_2$ that has been generated is detected via output terminals DO1 and DO2. Hence, the output part 60 outputs from the output terminals DO1 and DO2 mixed signals having frequencies that, by the multiplication of the LO signal $I_{LO}$ with the RF signal $V_{RF}$, are modulated to $f_+=f_1+f_2$ and $f_-=f_1-f_2$ with respect to the LO signal $I_{LO}$ and the RF signal $V_{RF}$.

In the spin high-frequency mixer 1 according to the present embodiment, the spin current generated by the input of the LO signal $I_{LO}$ (=A sin 2$\pi f_1$t) to the spin current generator 30 is fed to the TMR device 50 into which the RF signal $V_{RF}$ (=B sin 2$\pi f_2$t) has been input. In this way, in the TMR device 50, the LO signal $I_{LO}$ (=A sin 2$\pi f_1$t) and the RF signal $V_{RF}$ (=B sin 2$\pi f_2$t) are multiplied, generating mixed signals having a frequency modulated to $f_+=f_1+f_2$ and $L_-=f_1-f_2$ with respect to the LO signal $I_{LO}$ and the RF signal $V_{RF}$. Because mixed signals that have been frequency modulated with respect to the LO signal $I_{LO}$ and the RF signal $V_{RF}$ are generated in this way without using a diode, the generation of shot noise which originates from LO signals and is a problem in passive mixers that use diodes can be suppressed.

This is because, in a spin high-frequency mixer 1, with the spin current generator 30 and the TMR device 50 in a separated state, it is possible to have only the spin current generated by the spin current generator 30 flow into the free layer 53 of the TMR device 50 through the coupling nonmagnetic layer 12, thus enabling suppression of the shot noise leakage to the output that is associated with the LO signal $I_{LO}$ and the LO signal $I_{LO}$ current.

In addition, the resistance of the spin current generator 30 can be made sufficiently smaller than the resistance of the TMR device 50, enabling more effective suppression of LO signal $I_{LO}$ leakage to the output.

Enhancement in the noise characteristics can thus be achieved with the spin high-frequency mixer 1 related to the present embodiment. Moreover, by increasing the spin injection efficiency, the direction of magnetization of the free layer 53 can be controlled with a small spin current, enabling even better noise characteristics to be achieved.

Along with this, the dynamic range becomes larger even in a receiving circuit, which results in reduced power consumption.

In cases where direct conversion is carried out with an active mixer which uses a transistor, high-frequency characteristics are required of the transistor. As a result, the transistor cannot have a large surface area, which has made it difficult to suppress flicker noise. However, with the spin high-frequency mixer 1 of the present embodiment, unlike the transistor typically used in an active mixer, a low-noise, large surface area transistor may be selected for later amplification following down-conversion, enabling flicker noise to be suppressed.

A spin high-frequency mixer 1 capable of having improved noise characteristics can be easily manufactured by the method of manufacturing a spin high-frequency mixer 1 according to the present invention.

Figure 8:
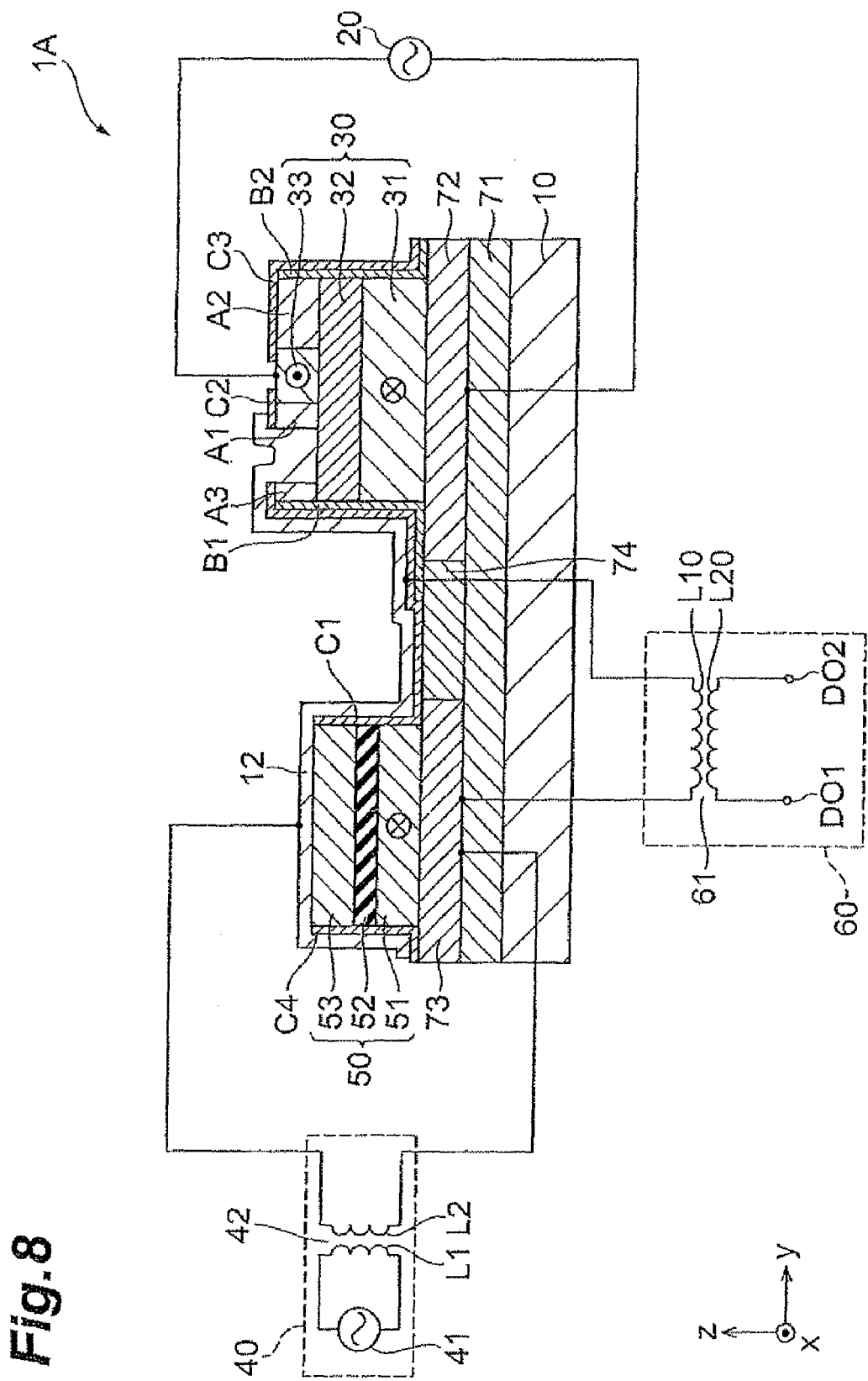
FIG. 8 is a diagram showing a spin high-frequency mixer which is configured as an actual device and is based on the spin high-frequency mixer 1 shown in FIG. 1.

FIG. 8 is a diagram showing a spin high-frequency mixer 1A which is configured as an actual device and is based on the spin high-frequency mixer 1 shown in FIG. 1. This spin high-frequency mixer 1A differs from the above-described spin high-frequency mixer 1 in the following ways. The present spin high-frequency mixer 1A has a dielectric layer 71 provided on a semiconductor substrate 10, and also has bottom electrode layers 72 and 73 which are provided on the dielectric layer 71 and have interposed therebetween a dielectric layer 74. A spin current generator 30 is provided on top of the bottom electrode layer 72, and a TMR device 50 is provided on top of the bottom electrode layer 73. At either side of a second spin filter layer 33 on a nonmagnetic layer 32, a partial dielectric layer A1 is provided on the inside thereof and another partial dielectric layer A2 is provided on the outside. In addition, yet another partial dielectric layer A3 is provided at a remove from partial dielectric layer A1 so as to leave the nonmagnetic layer 32 exposed. Another partial dielectric layer B1 which covers the area from the dielectric layer 74 to partial dielectric layer A3 and yet another partial dielectric layer B2 which covers the sidewall of the first spin filter layer 31, the sidewall of the nonmagnetic layer 32 and the sidewall of partial dielectric layer A2 are also provided.

Also provided are another partial dielectric layer C1 which covers a region that extends from one sidewall of the TMR device 50 to partial dielectric layer B1 and partial dielectric layer A3; another partial dielectric layer C2 which covers partial dielectric layer A1 and part of the second spin filter layer 33; yet another partial dielectric layer C3 which covers part of the second spin filter layer 33 so as to leave part of the second spin filter layer 33 exposed, covers partial dielectric layer A2 and partial dielectric layer B2, and is separated from partial dielectric layer C2; and still another partial dielectric layer C4 which covers the other sidewall of the TMR device 50. The coupling nonmagnetic layer 12 is provided so as to bridge from partial dielectric layer C4 onto the nonmagnetic layer 32. Other aspects of the construction of the spin high-frequency mixer 1A being identical or similar to those of the spin high-frequency mixer 1 described above, repeated explanations of those aspects are omitted here. The spin high-frequency mixer 1A shown in FIG. 8 is manufactured by the following steps.

Spin Current Generator Forming Step

Figure 9:
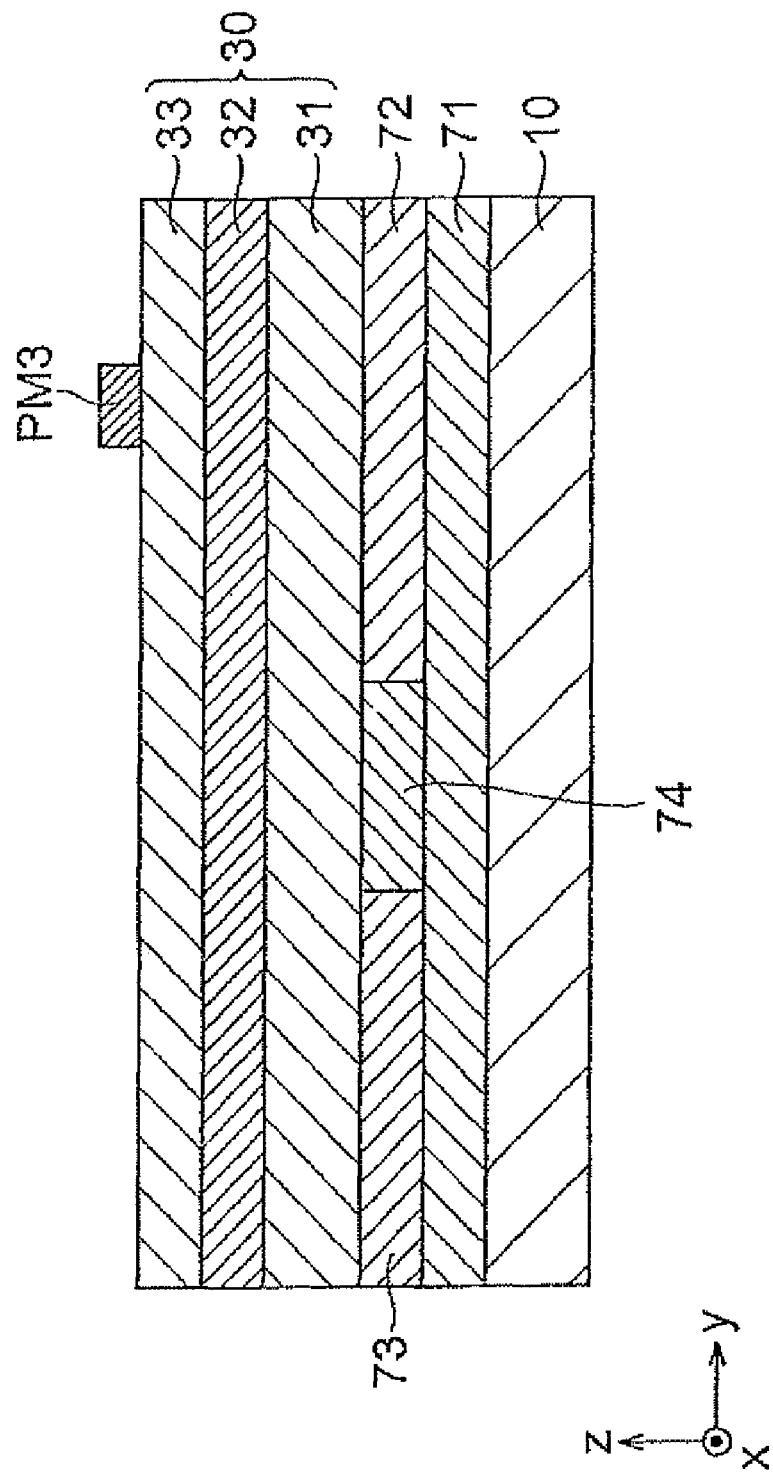
FIG. 9 is a schematic diagram showing a step in a method of manufacturing the spin high-frequency mixer shown in FIG. 8.

First, as shown in FIG. 9, the dielectric layer 71 is formed on the semiconductor substrate 10. Next, the bottom electrode layers 72 and 73 are formed on the dielectric layer 71 in such a way as to be separated by a dielectric layer 74 therebetween. The bottom electrode layers 72 and 73 and the dielectric layer 74 are formed so as to be planar using damascene treatment or the like by chemical mechanical planarization (CMP). A first spin filter layer 31, a nonmagnetic layer 32, and a second spin filter layer 33 are then deposited thereon in this order. Next, a resist mask PM3 is formed with a resist on the second spin filter layer 33 on the first bottom electrode layer 72.

Figure 10:
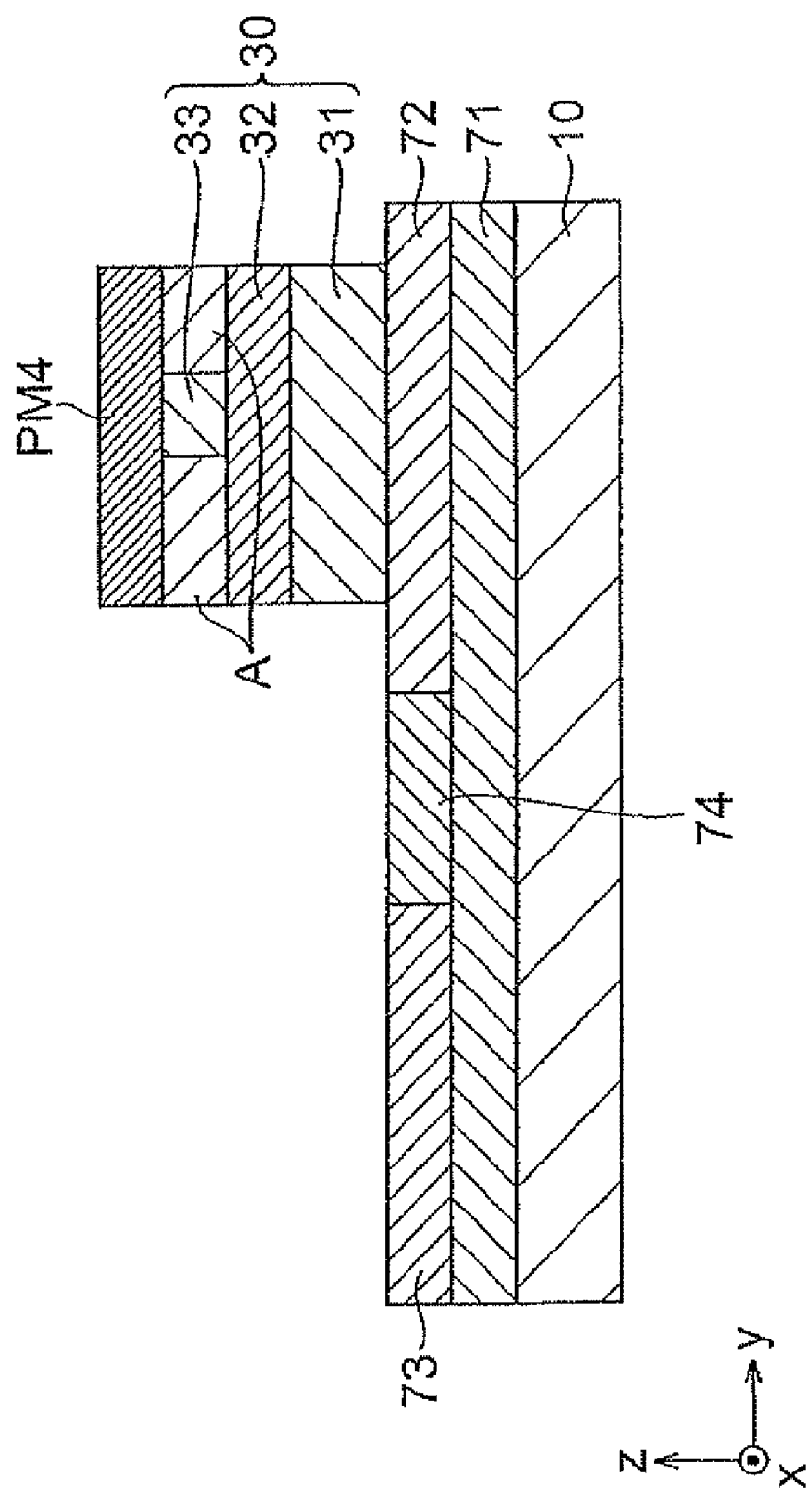
FIG. 10 is a schematic diagram showing another step in a method of manufacturing the spin high-frequency mixer shown in FIG. 8.
Figure 11:
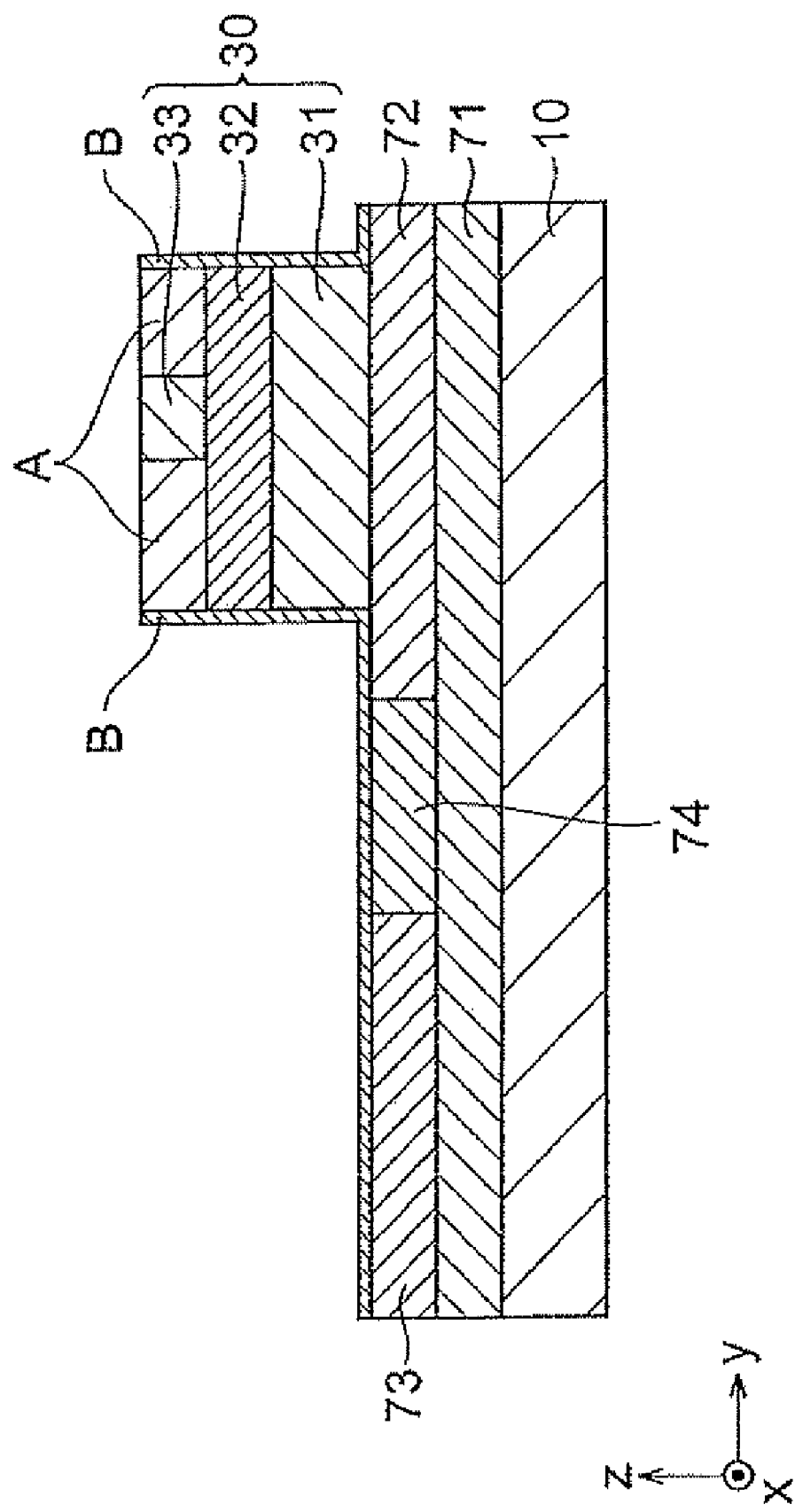
FIG. 11 is a schematic diagram showing yet another step in a method of manufacturing the spin high-frequency mixer shown in FIG. 8.

The second spin filter layer 33 is then etched while being masked a portion thereof by the resist mask PM3. A dielectric layer A is then deposited as a film, following which the resist mask PM3 is stripped, thereby lifting off the unnecessary portion of the dielectric layer A. Next, as shown in FIG. 10, a resist mask PM4 having a larger pattern than the pattern of the initial resist mask PM3 is formed on the dielectric layer A and the second spin filter layer 33 on top of the first bottom electrode layer 72 and, using this resist mask PM4, the dielectric layer A, the nonmagnetic layer 32 and the first spin filter layer 31 are etched. In this way, a spin current generator 30 comprising a first spin filter layer 31, a nonmagnetic layer 32 and a second spin filter layer 33 is formed. Next, a dielectric layer B comprising the materials making up partial dielectric layers B1 and B2 is deposited as a film, following which the resist mask PM4 is stripped away, thereby lifting off the unnecessary portion of the dielectric layer B (see FIG. 11).

TMR Device Forming Step

Figure 12:
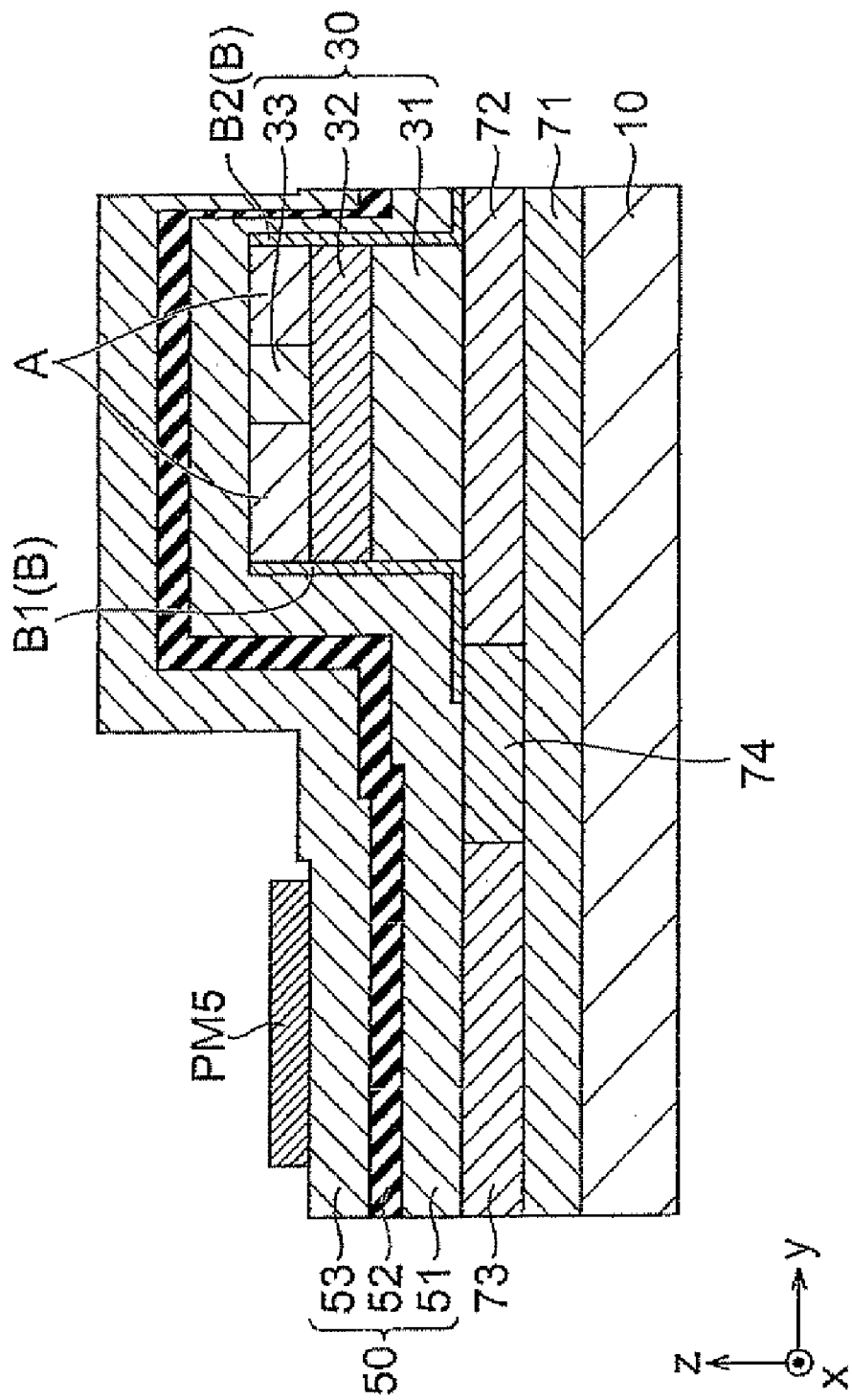
FIG. 12 is a schematic diagram showing a further step in a method of manufacturing the spin high-frequency mixer shown in FIG. 8.
Figure 13:
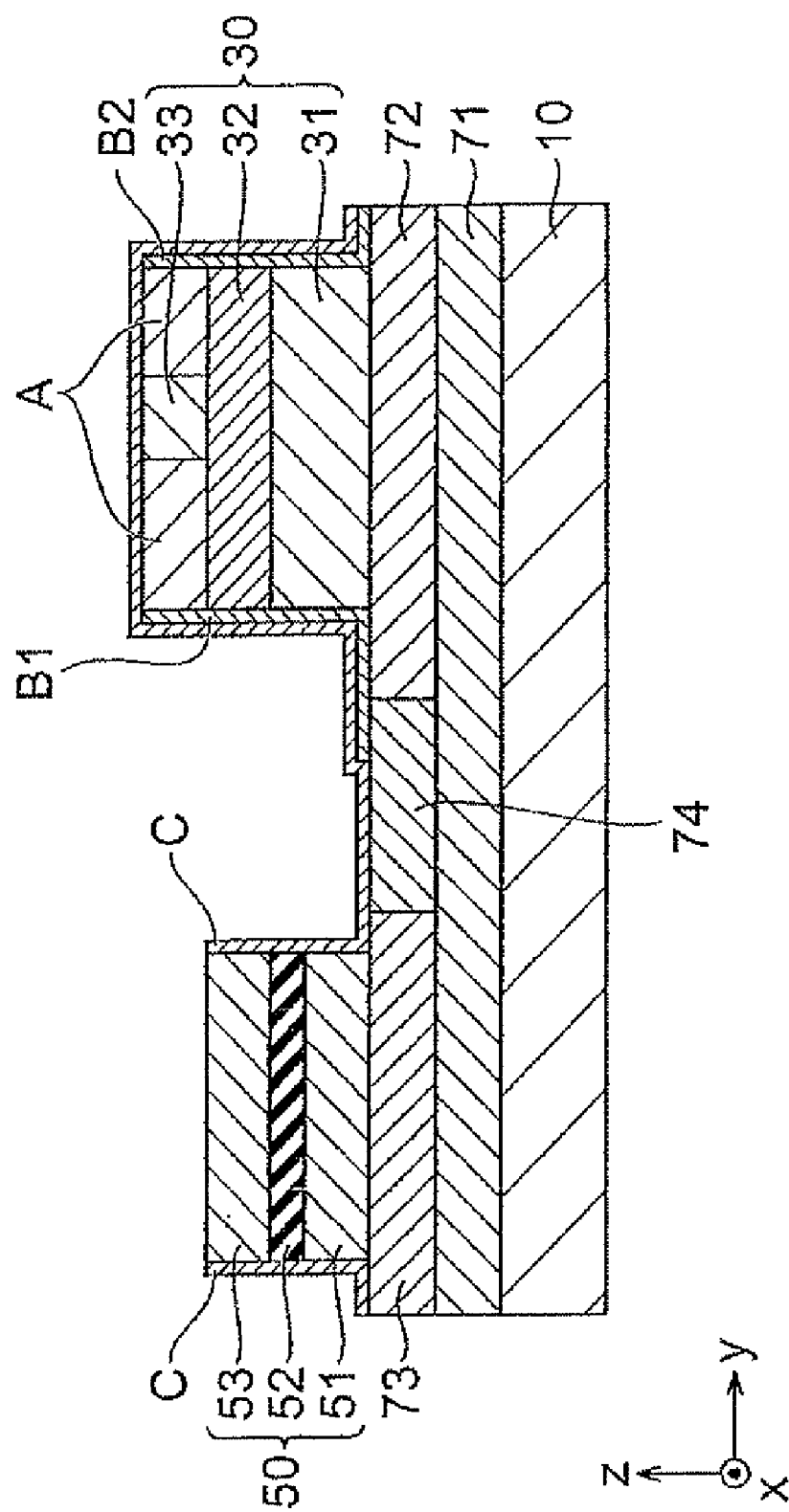
FIG. 13 is a schematic diagram showing a still further step in a method of manufacturing the spin high-frequency mixer shown in FIG. 8.

In this step, first, the portion of the dielectric layer B where the TMR device 50 (see FIG. 12) is to be formed is etched, leaving the second bottom electrode layer 73 exposed. In this way, referring to FIG. 12, a partial dielectric layer B1 and a partial dielectric layer B2 are formed from the dielectric layer B (thus, of the dielectric layer B, the portions that become partial dielectric layer B1 and partial dielectric layer B2 remain). A pinned layer 51, a tunnel bather layer 52 and a free layer 53 are then successively deposited in a region extending from the second bottom electrode layer 73 to partial dielectric layer B2. A rectangularly shaped resist mask PM5 is then formed on the free layer 53 on the second bottom electrode layer 73, and the unmasked region is etched with a dry etching process or the like until the pinned layer 51 disappears, thereby forming the TMR device 50. Next, without removing this resist mask PM5, a dielectric layer C is formed around the TMR device 50 by using, for example, a sputtering system. The resist mask PM5 is then removed (see FIG. 13).

Nonmagnetic Layer Exposure Step

Figure 14:
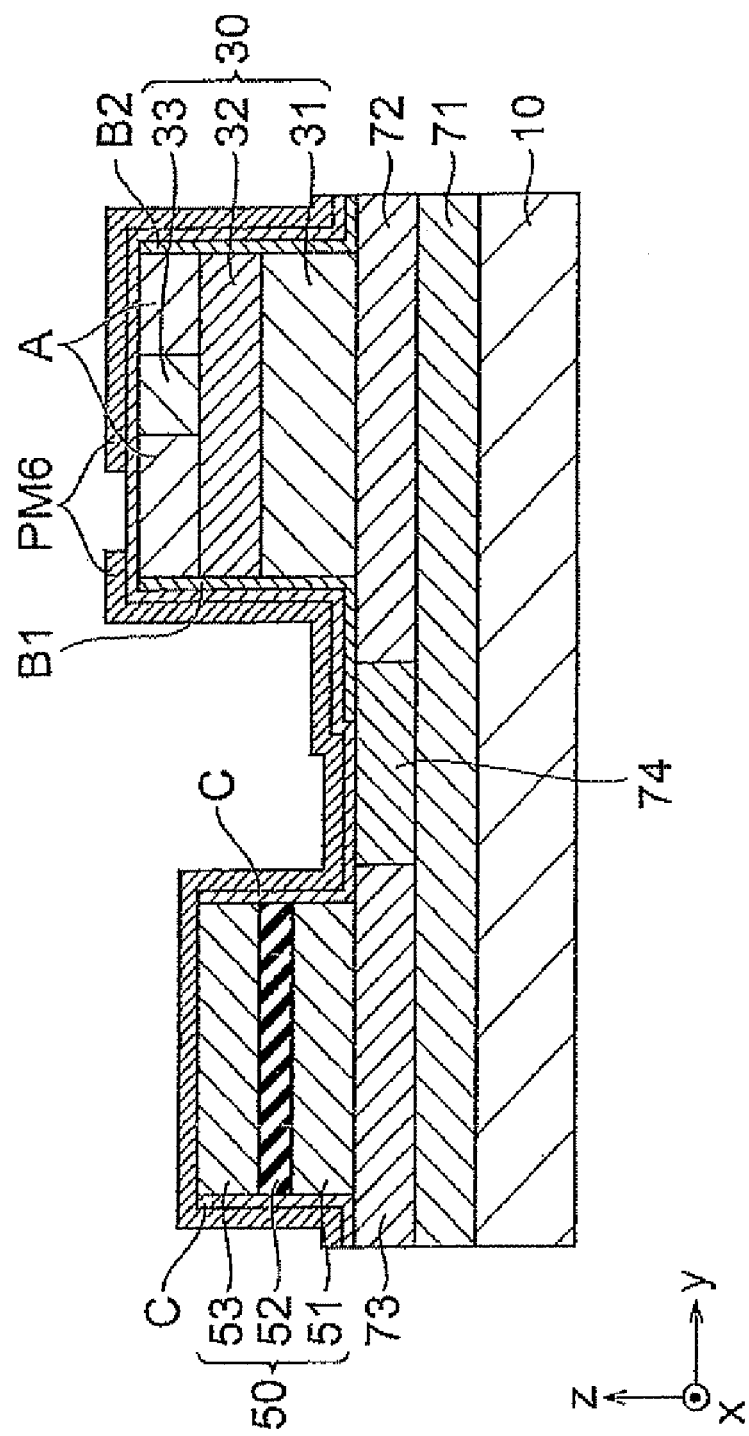
FIG. 14 is a schematic diagram showing a yet further step in a method of manufacturing the spin high-frequency mixer shown in FIG. 8.

In this step, as shown in FIG. 14, using photolithography and etching process, portions of the dielectric layer C and the dielectric layer A on the inside of the second spin filter layer 33 on the nonmagnetic layer 32 are etched, and then the nonmagnetic layer 32 is exposed. Specifically, a resist mask PM6 which masks portions other than those to be removed is formed, following which the dielectric layer C and the dielectric layer A are etched with a dry etching process or the like until the nonmagnetic layer 32 is exposed, following which the resist mask PM6 is removed. In this way, portions A1, A2 and A3 of the dielectric layer A remain as shown in FIG. 8.

Coupling Nonmagnetic Layer Forming Step

Next, a coupling nonmagnetic layer 12 coupling the TMR device 50 and the spin current generator 30 which are electrically isolated mutually is formed (see FIG. 8). In this step, a resist pattern which masks the top of the dielectric layer C outside the top of the nonmagnetic layer 32 is formed, and a nonmagnetic layer comprising copper or the like is formed throughout. The resist is then lifted off, thereby forming a coupling nonmagnetic layer 12 which bridges from the TMR device 50 to above the nonmagnetic layer 32. In this way, the nonmagnetic layer 32 of the spin current generator 30 and the TMR device 50 are connected by the coupling nonmagnetic layer 12 while avoiding direct contact between the second spin filter layer 33 and the coupling nonmagnetic layer 12.

Thereafter, using photolithography and etching process, the dielectric layer C is removed from above the second spin filter layer 33. In this way, as shown in FIG. 8, portions C1, C2 and C3 and C4 of the dielectric layer C remain. The spin high-frequency mixer 1A is then completed by connecting an LO signal generator 20 between the first bottom electrode layer 72 and the second spin filter layer 33 and by connecting an RF signal output part 40 and an output part 60 between the second bottom electrode layer 73 and the coupling nonmagnetic layer 12. This spin high-frequency mixer 1A enables an effect similar to the effect of the earlier described spin high-frequency mixer 1 to be achieved.

Second Embodiment

Figure 15:
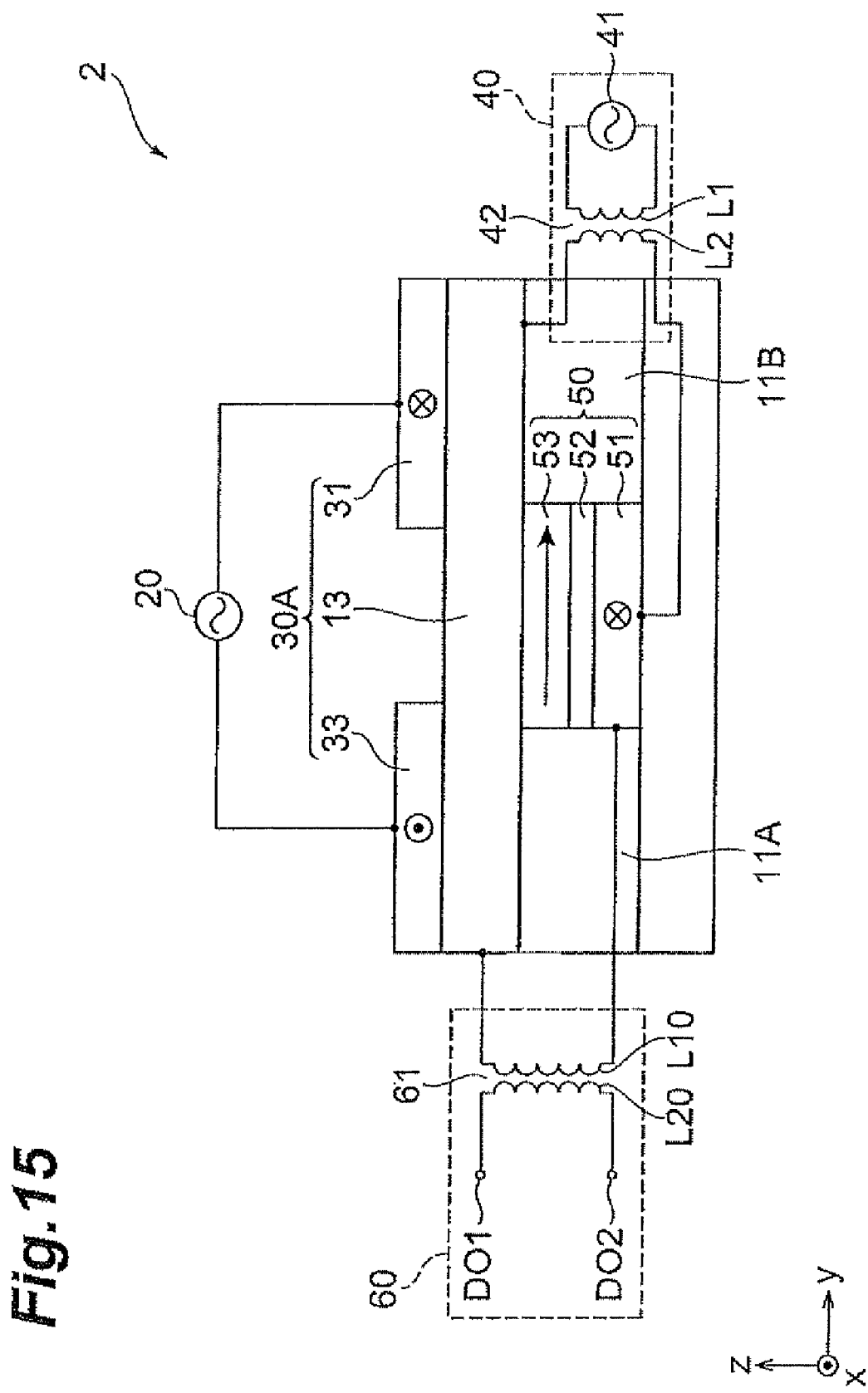
FIG. 15 is a schematic view showing a spin high-frequency mixer according to a second embodiment of the invention.

FIG. 15 is a schematic view showing a spin high-frequency mixer 2 according to a second embodiment of the invention. In contrast with the spin high-frequency mixer 1 of the first embodiment in which a TMR device 50 and a spin current generator 30 are separated by an intervening dielectric layer 11 and coupled by a coupling nonmagnetic layer 12 as shown in FIG. 8, the spin high-frequency mixer 2 of the present embodiment does not have a coupling nonmagnetic layer 12 and further differs both in that, instead of the spin current generator 30 described above, a directly connected spin current generator 30A is provided on the TMR device 50, and in that dielectric layers 11A and 11B are provided on either side of the TMR device 50. Other aspects of the construction of this spin high-frequency mixer 2 being the same as those of the spin high-frequency mixer 1, like symbols have been used to denote like elements, and the unnecessary repetition of explanations is avoided below.

The spin current generator 30A comprises a nonmagnetic layer 13 provided on a TMR device 50 and on the dielectric layers 11A and 11B provided on either side of the TMR device 50, and a first spin filter layer 31 and a second spin filter layer 33 which are mutually separated in respective regions on the nonmagnetic layer 13 corresponding to regions where the dielectric layers 11A and 11B are provided.

The spin high-frequency mixer 2 according to the second embodiment, by employing such a configuration, is able to achieve effects similar to those of the spin high-frequency mixer 1 according to the first embodiment, and is additionally capable of exhibiting desirable effects such as a smaller size and a higher degree of integration.

Preferred embodiments of the invention have been described above, although various modifications of these embodiments are possible without departing from the spirit and scope of the invention. Specifically, in these embodiments, the output part 60 comprises a transformer 61. However, the output part 60 may instead comprises a capacitor or may instead comprises output terminals connected to, respectively, the pinned layer 51 and the coupling nonmagnetic layer 12.

A CoFe alloy or a CoFeB alloy is typically used as the ferromagnetic material making up the first spin filter layer 31, the second spin filter layer 33, the pinned layer 51 and the free layer 53. However, use may instead be made of cobalt, a half metal such as a Hensler alloy (e.g., $Co_2MnSi$), or a ferromagnetic silicide such as $Fe_3Si$. The nonmagnetic layer 32 and the coupling nonmagnetic layer 12 are typically made of copper, but may instead be made of ruthenium, rhodium, iridium, gold or silver.

What is claimed is:

1. A spin high-frequency mixer comprising:
    a spin current generator generating a spin current upon input of a local oscillator signal;
    a magnetoresistance device which inputs a high-frequency signal and the spin current, and generates a mixed signal; and
    an output device outputting the generated mixed signal from the magnetoresistance device.

2. The spin high-frequency mixer of claim 1, wherein the spin current generator comprises:
    a first spin filter layer comprising a ferromagnetic material;
    a second spin filter layer having a direction of magnetization opposite to that of the first spin filter layer; and
    an electrically conductive, nonmagnetic layer interposed between the first spin filter layer and the second spin filter layer,
the magnetoresistance device comprises:
    a pinned layer having the same direction of magnetization as those of the first spin filter layer or the second spin filter layer;
    a free layer which changes magnetization direction upon injection of the spin current; and
    a tunnel bather layer interposed between the pinned layer and the free layer, and
the nonmagnetic layer and the free layer are electrically connected.

3. The spin high-frequency mixer of claim 2, wherein
    the spin current generator and the magnetoresistance device are provided at separated positions on one semiconductor substrate,
    the second spin filter has an end removed therefrom, and
    a coupling nonmagnetic layer is provided so as to bridge between an exposed region of the nonmagnetic layer where the end of the second spin filter layer has been removed and the free layer of the magnetoresistance device, and so as not to come into contact with the second spin filter layer.

4. The spin high-frequency mixer of claim 1, wherein a high-frequency signal source which inputs the high-frequency signal to the magnetoresistance device has a higher impedance than the magnetoresistance device.

5. The spin high-frequency mixer of claim 1, wherein the output device has a higher impedance than the magnetoresistance device.

6. A method of manufacturing a spin high-frequency mixer, comprising the steps of:
    forming a spin current generator by successively depositing, on a semiconductor substrate, a first spin filter layer, a nonmagnetic layer and a second spin filter layer;
    forming on the semiconductor substrate, at a position separated from the spin current generator, a magnetoresistance device comprising a pinned layer, a tunnel barrier layer and a free layer;
    removing an end of the second spin filter layer; and
    forming a coupling nonmagnetic layer so as to bridge between an exposed region of the nonmagnetic layer where the end of the second spin filter layer has been removed and the free layer of the magnetoresistance device, and so as not to come into contact with the second spin filter layer.

7. A spin high-frequency mixer comprising:
    a spin current generator connected to a local oscillator signal generator;
    a magnetoresistance device connected to the spin current generator and a high-frequency signal source; and
    an output device connected to the magnetoresistance device.

* * * * *